US012685022B2

(12) United States Patent
Casset

(10) Patent No.: US 12,685,022 B2
(45) Date of Patent: Jul. 14, 2026

(54) PIEZORESISTIVE TRANSDUCER DEVICE WITH UPPER FACE THAT IS INTERGRALLY EXPOSED OR ONLY COVERED WITH AN ELECTRICAL CONNECTING ELEMENT

(71) Applicant: COMMISSARIAT A L'ENERGIE ATOMIQUE ET AUX ENERGIES ALTERNATIVES, Paris (FR)

(72) Inventor: Fabrice Casset, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1128 days.

(21) Appl. No.: 17/659,036

(22) Filed: Apr. 13, 2022

(65) Prior Publication Data

US 2022/0336725 A1 Oct. 20, 2022

(30) Foreign Application Priority Data

Apr. 14, 2021 (FR) ...................................... 21 03867

(51) Int. Cl.
*H10N 30/02* (2023.01)
*H10N 30/88* (2023.01)
*H10N 30/00* (2023.01)

(52) U.S. Cl.
CPC ........... *H10N 30/02* (2023.02); *H10N 30/883* (2023.02); *H10N 30/708* (2024.05)

(58) Field of Classification Search
CPC .... H10N 30/02; H10N 30/883; H10N 30/708; H10N 30/01; H10N 30/072;
(Continued)

(56) References Cited

U.S. PATENT DOCUMENTS

2009/0294263 A1* 12/2009 De Vries .............. H03K 17/964
200/181
2012/0186739 A1* 7/2012 Gerner ................... B41J 2/1623
156/272.8
(Continued)

FOREIGN PATENT DOCUMENTS

EP 3 213 923 A1 9/2017
FR 3 082 997 A1 12/2019
(Continued)

OTHER PUBLICATIONS

Preliminary French Search Report issued Jan. 19, 2022 in French Application 21 03867 filed on Apr. 14, 2021, 10 pages (with English Translation of Categories of Cited Documents & Written Opinion).
(Continued)

*Primary Examiner* — Emily P Pham
(74) *Attorney, Agent, or Firm* — Oblon, McClelland, Maier & Neustadt, L.L.P.

(57) ABSTRACT

A piezoelectric transducer device includes a support, a piezoelectric element, a first connecting element and a second electrical connecting element, the piezoelectric element being carried by the support and each of the first and second electrical connecting elements being electrically connected, respectively, to a first area and a second area, distinct from the first area, of the piezoelectric element, the piezoelectric element including a lower face opposite the support and an upper face, opposite to the lower face, wherein the upper face is integrally exposed or is covered, partially or not, only with the second electrical connecting element.

17 Claims, 7 Drawing Sheets

(58) Field of Classification Search
    CPC ...... H10N 30/074; H10N 30/50; H10N 30/88;
                H10N 30/853; H10N 30/87; H10N 30/20
    See application file for complete search history.

(56)                    References Cited

U.S. PATENT DOCUMENTS

| | | |
|---|---|---|
| 2017/0194937 A1 | 7/2017 | Iwamoto |
| 2017/0253039 A1 | 9/2017 | Kimura et al. |
| 2021/0260859 A1 | 8/2021 | Le Rhun et al. |
| 2021/0378101 A1 | 12/2021 | Souriau et al. |

FOREIGN PATENT DOCUMENTS

| | | |
|---|---|---|
| FR | 3 084 556 A1 | 1/2020 |
| JP | 2004-200382 A | 7/2004 |
| JP | 2016-162820 A | 9/2016 |
| WO | WO 2022/104099 A1 | 5/2022 |

OTHER PUBLICATIONS

Poncet et al., "Static and Dynamic Studies of Electro-Active Polymer Actuators and Integration in a Demonstrator", Actuators, 6, 18, 2017, 10 pages.
Natta et al., "Soft and flexible piezoelectric smart patch for vascular graft monitoring based on Aluminum Nitride thin film", Scientific Reports, 9:8392, 2019, 10 pages.
Casset et al., "Low voltage actuated plate for haptic applications with PZT thin-film", 2013 Transducers & Eurosensors XXVII: The 17th International Conference on Solid-State Sensors, Actuators and Microsystems 2013, 1 page (abstract only).

* cited by examiner

SECTION A-A

PIEZORESISTIVE TRANSDUCER DEVICE WITH UPPER FACE THAT IS INTERGRALLY EXPOSED OR ONLY COVERED WITH AN ELECTRICAL CONNECTING ELEMENT

TECHNICAL FIELD

The present invention relates to the field of piezoelectric devices.

In general, this device type calls on the transduction capacitance of piezoelectric materials, or still possibly in an operating domain where they are ferroelectric. This concerns actuators in the form of microelectronic devices. By microelectronic device, it should be understood any type of device made with microelectronics means. These devices encompass micromechanical or electromechanical devices, in the microscopic level, which could also include nanometric dimensions.

PRIOR ART

Devices such as sensors or actuators are increasingly prevalent. In particular, the piezoelectric transducers are well suited to serve as sensors via the direct piezoelectric effect or as actuators via the indirect piezoelectric effect. Hence, it is interesting to integrate such transducers or networks of transducers onto different surfaces, including non-planar or flexible surfaces.

Piezoelectric actuators are available on the market in the form of flexible patches, for example like those sold under the trademark DuraAct® by the PI Ceramic company. Such patches integrate one or several element(s) made of a piezoelectric ceramic cooperating by their two faces with two electrodes, the whole being embedded in an electrical insulation coating configured to keep some flexibility. Typically, the actuators formed in this manner have a thickness larger than 400 microns which is still somehow considerable.

However, it seems to be difficult to obtain monitored thicknesses, possibly smaller, with this type of technology. Besides, the flexibility of the device is directly affected by the structure of this type of transducers.

Hence, there is a need for providing piezoelectric transducer devices that address at least part of the technical limitations of the prior art.

The other objects, features and advantages of the present invention will appear upon examining the following description and the appended drawings. It should be understood that other advantages could be incorporated.

SUMMARY

To achieve this objective, according to one embodiment, a piezoelectric transducer device is provided comprising a support, a piezoelectric element, a first connecting element and a second electrical connecting element, the piezoelectric element being carried by the support and each of the first and second electrical connecting elements being electrically connected, respectively, to a first area and a second area, distinct from the first area, of the piezoelectric element, the piezoelectric element including a lower face opposite the support and an upper face, opposite to the lower face.

Advantageously, the device is such that the upper face is integrally exposed or is covered, partially or not, only with the second electrical connecting element.

Thus, a device is formed wherein the piezoelectric element is not completely embedded in a polymer coating, in contrast with the case of current devices. Therefore, the piezoelectric element is mechanically free much more than current piezoelectric detection techniques. These features allow improving the mechanical behaviour of the entire device.

While it is currently considered that the piezoelectric element is necessarily embedded in the rest of the device, this bias is fought with a stacking that is more favourable to mechanical flexibility and to electromechanical coupling between the actuator and the future surface that will receive the actuator.

Another aspect relates to a method for manufacturing a piezoelectric transducer device comprising a support, a piezoelectric element, a first connecting element and a second electrical connecting element, the piezoelectric element being carried by the support and each of the first and second electrical connecting elements being electrically connected, respectively, to a first area and a second area, distinct from the first area, of the piezoelectric element, the piezoelectric element including a lower face opposite the support and an upper face, opposite to the lower face, characterized in that it comprises:

a gluing of a piezoelectric block on the support so as to place the lower face of the piezoelectric block opposite the support;

a thinning of the piezoelectric block from its upper face opposite to its lower face, so as to obtain the piezoelectric element with a predefined dimension in thickness, the upper face of the piezoelectric element being left integrally exposed or being left covered, partially or not, only with the second electrical connecting element.

According to one aspect, the piezoelectric element is obtained after a phase of thinning a piezoelectric block, preferably while this block is mounted over a substrate, which allows reaching a target thickness of the piezoelectric element which is perfectly monitored within a wide range of values. In particular, it is possible to obtain final piezoelectric elements with a thickness comprised between 10 and 100 microns. Preferably, the piezoelectric element is mounted, and then thinned, and electrically connected while the support is carried by a substrate, for example made of a semiconductor material, barely sensitive to the temperature rise and more rigid than the support, which enables a heat treatment for improving the piezoelectric properties of the element and facilitates the operations, for example the thinning operations.

Preferably, the method is configured to obtain a piezoelectric transducer device according to any one of the embodiments provided herein.

The device could be integrated, alone or with others, into piezoelectric actuators, in particular in the form of stickers that could be attached on a more complex system; in particular, it is possible to make vibrating plate systems wherein at least one device is mechanically linked to a plate for the vibrating actuator under the electrical control of the device.

BRIEF DESCRIPTION OF THE FIGURES

The aims, objects, as well as the features and advantages of the invention will appear better from the detailed description of an embodiment of the latter which is illustrated by the following appended drawings wherein.

Figure 1:
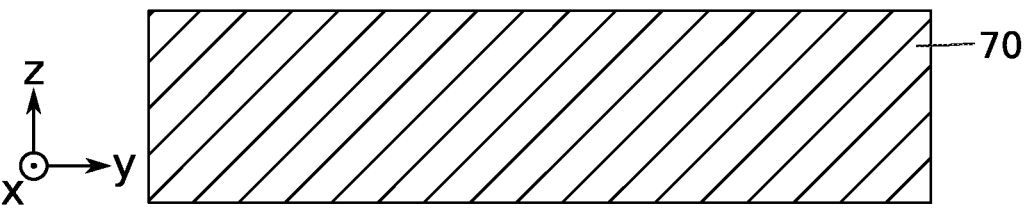
FIGS. 1 to 8 represent possible successive steps for the manufacture of a device.

The drawings are provided as examples and do not limit the invention. They form schematic principle representations intended to facilitate understanding of the invention and are not necessarily to the scale of practical applications.

DETAILED DESCRIPTION

Before beginning a detailed review of embodiments of the invention, optional features that could be used in combination or alternatively are set out hereinafter:

the device comprises a bead 50 made of a polymer material surrounding the piezoelectric element 20;

the bead 50 extends laterally at less than 5,000 microns from the piezoelectric element 20;

the bead 50 has an upper face coplanar with the upper face 22;

the second area is located on the upper face 22;

a coverage 60 made of a polymer material partially covering the second connecting element and at least partially the bead 50, without covering the upper face 22;

the coverage 60 extends laterally beyond the bead; thus, for example, the coverage 60 could cover the entire surface of the support 10 except at the level of the upper face 22 of the element 20 and, possibly, at the level of contact resumption areas of the tracks 41, 42 for connection to an electrical circuit such as a power supply source;

the first area and the second area are located on the lower face 21; in this case, it is also possible to provide a coverage 60 made of a polymer material partially covering the first connecting element and the second connecting element, without covering the upper face 22;

the support 10 is flexible;

the ceramic piezoelectric element 20 has a dimension in thickness smaller than or equal to 100 microns, and preferably larger than or equal to 10 microns; the device according to the invention forms a mechanical actuator;

the piezoelectric element 20 is at least partially made of a ceramic;

before thinning, a formation of the support 10 over a substrate 70, and after thinning, a dismount of the support 10 off the substrate 70;

a formation of the first connecting element and of the second connecting element, wherein gluing is configured to set the first connecting element and the second connecting element in contact, respectively, with the first area and the second area, the first area and the second area being located on the lower face 21 of the piezoelectric element 20;

a supply of the piezoelectric block 23 which comprises an electrode on its lower face, a division of the electrode into a first portion and a second portion which are electrically insulated from each other, the first portion and the second portion forming, respectively, the first area and the second area.

It is specified that, in the context of the present invention, the term "over" or "on top" does not necessarily means "in contact with". Thus, for example, the deposition of a layer over another layer, does not necessarily mean that the two layers are directly in contact with each other but this means that one of the layers covers at least partially the other one while being, either directly in contact therewith, or while being separated therefrom by a film, or else another layer or another element. Thus, the terms "covers" and "coverage" could mean "directly covers" and "direct coverage" as well as "indirectly covers" and "indirect coverage", respectively.

It is specified that in the context of the present invention, the thickness of a layer or of the substrate is measured according to a direction perpendicular to the surface according to which this layer or this substrate has its maximum extension. If a layer is not totally planar, in particular because it has defects that could be in relief on the exposed face of said layer, the thickness should be understood as the dimension of this layer off its defects.

Some portions of the device of the invention may have an electrical function. Some are used for electrical conduction properties and this should be understood as having an electrically-conductive nature, elements formed by at least one material having enough electrical conductivity, in the application, to fill the desired function.

By substrate, it should be understood an element, a layer or other "based" on a material M, a substrate, an element, a layer comprising this material M alone or this material M and possibly other materials, for example alloyed elements, impurities or doping elements. Where appropriate, the material M may have different stoichiometries.

By "flexible", in particular to qualify the support, it should be understood that the support has a considerable flexibility, which includes in particular supports meeting at least one of the following conditions:

the support, which may carry a piezoelectric or ferroelectric actuator, is based on one or several polymer material(s), these may be selected from among polyester, polyimide, polytetrafluoroethylene, polyetheretherketone;

the support has a bending deformation capacity with a radius of curvature of less than one metre, and preferably of less than 200 mm, without break-up;

the material of the support has a Young's modulus lower than or equal to 5,000 MPa, and preferably lower than or equal to 3,500 MPa; however, the support may include at least one layer of a less elastic material, such as glass, and, in this case, with lower maximum thicknesses to preserve flexibility.

Before describing methods for manufacturing a piezoelectric transducer device 1, different examples of structures that could be obtained are described hereinafter.

Figure 9:
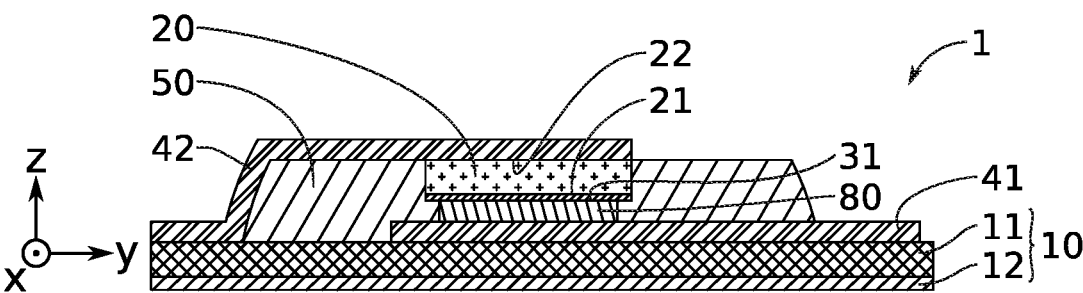
FIG. 9 illustrates a first example of a device.

Thus, FIG. 9 shows, in section, an example of a stack forming a piezoelectric transducer device 1. A support 10 is illustrated, and it is preferably made flexible. For example, it includes an upper layer 11 which will receive a piezoelectric transduction stack; according to one example, the upper layer is made of or based on a SINR polymer; its thickness may be smaller than 100 microns, and for example 80 microns. A lower layer 12 is also represented, wherein we will see that its interface with an underlayer could be used for manufacturing. For example, the layer 12 may be made of or based on TEOS (tetraethyl orthosilicate); its thickness is advantageously smaller than that of the upper layer 11; the thickness may, for example, be smaller than 1 micron, and preferably 500 nm.

For example, the overall thickness of the support 10 may be smaller than 200 microns, and preferably smaller than 100 microns.

The upper face of the support 10 serves as a support for a transducer stack. The latter successively comprises, in this first example, a first electrical connecting element, a piezoelectric element (which is herein defined as an element made of a material having piezoelectric properties, which includes piezoelectric materials that could function, in particular under some electrical load conditions, so as to have a ferroelectric effect; thus, ferroelectric materials are also considered to make the piezoelectric element) and a second electrical connecting element.

The first electrical connecting element is intended to achieve an electrical connection of a first area of the piezoelectric element. In combination with the second electrical connecting element connecting a second area of the piezoelectric element, it is thus possible to, either apply an electric control current to the piezoelectric element, or recover a current generated by the piezoelectric element. The first area and the second area of the piezoelectric element are elements of the outer surface of the piezoelectric element.

The first electrical connecting element is at least partially formed by a first track 41 made of an electrically-conductive material, and which may extend over the support 10 according to a pattern suited for the electrical connection of the piezoelectric element 20. In this embodiment, the first track 41 extends at least partially beneath the piezoelectric element 20, and preferably, it also extends laterally to achieve an offset connection to an electrical connection line 3, visible in FIG. 10. It is possible to use electrically-conductive materials such as tungsten or gold to form the track 41 in one or several layer(s).

The first electrical connecting element may also comprise at least one portion of a bonding layer 80 enabling fastening of the piezoelectric element over the support 10. In this context, the layer 80 consists of conductive glue, for example silver paste.

The piezoelectric element 20 may be made of a piezoelectric ceramic, in particular of PZT. In the represented example, it has an indicative rectangular parallelepiped shape. Its dimension in thickness may be more limited than in common patches, and it may in particular be smaller than or equal to 100 microns. At the same time, or alternatively, the dimension in thickness may be larger than or equal to 10 microns.

The piezoelectric element 20 includes a face, called lower face 21, directed opposite the support 10; conversely, an upper face 22 is directed outwardly from the device. In particular, the references 21 and 22 also appear in the embodiment provided in FIG. 16.

Preferably, at least one of the lower and upper faces extends parallel to the upper face of the support 10. Preferably, the lateral extension of the piezoelectric element 20 is smaller than the lateral extension of the support 10.

The location of the first and second areas of the piezoelectric element 20 at which the electrical connections are formed may, in particular, be selected according to the intended applications of the device. In particular, both could lie at the same face of the piezoelectric element amongst its lower face 21 and its upper face 22. Each could also lie over one of these two opposite faces 21, 22.

Figure 13:
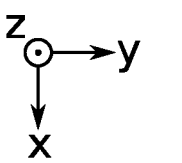
FIG. 13 shows a possibility of forming an electrode over a face of an element.
Figure 13:
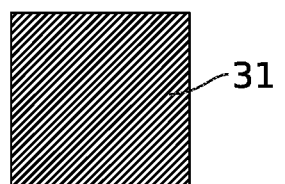

According to the illustration, the piezoelectric material itself is in contact with an electrically-conductive underlayer, achieving the interface between the piezoelectric element 20 and the first electrical connecting element, acting as an electrode. It may consist of a metal layer. FIG. 13 gives an example of a first electrode 11 producing the lower face 21 of the element 20.

Finally, FIG. 9 shows an embodiment of the second electrical connecting element, with a second track 42, which may be formed in materials similar to those mentioned for the track 41, and extending over at least one portion of the upper face 22 of the piezoelectric element 20 to ensure the electrical connection thereof. As is the case for the track 41, the track 42 extends, according to this example, laterally beyond the element 20 to enable an advantageously offset electrical connection.

The stack thus provided includes, in this embodiment, a bead 50 made of an electrically-insulating material. It may consist of a polymer material, for example an epoxy resin. It is configured to be applied laterally over the piezoelectric element 20, so as to surround it, over at least one portion of the contour of the element 20. Preferably, the bead 50 is applied over at least two opposite edges of the contour of the element 20, and preferably over the four sides of the element 20. Preferably, the bead 50 completely surrounds the element 20.

The bead 50 allows holding and protecting the piezoelectric element 20, and mechanically reinforcing the whole. In addition, it advantageously isolates the first track 41 and the second track 42, or, more generally, the first electrical connecting element and the second electrical connecting element. To this end, at least one portion of the second electrical connecting element, such as the track 42 represented in FIG. 9, is disposed over the bead 50; at the same time or alternatively, the bead 50 covers at least one portion of the first electrical connecting element, such as the portion of the track 41 extending beneath and proximate to the piezoelectric element 20.

Preferably, the bead 50 has a planar upper face. Advantageously, this is also the case of the piezoelectric element 20. In addition, these upper faces may be coplanar. In this context, only the track 42 extends on top of this set, such that the holding, in particular the lateral holding, of the piezoelectric element 20 is achieved by the bead 50, yet without generating an excessive height of this bead, in order to preserve the flexibility of the device. Furthermore, the bead 50 does not preferably extend over the entire surface of the support 10.

Figure 12:
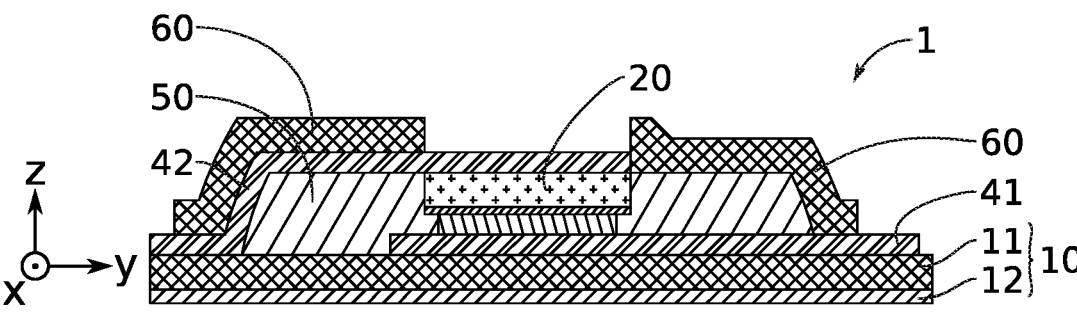

FIG. 12 reflects a variant close to the case of FIG. 9, in particular in that the support, the first electrical connecting element, the piezoelectric element and the second electrical connecting element could be made in the same manner. What is more, in this embodiment, a coverage layer 60 extends on top of the bead 50, and, when this element is present, on top of the second electrical connecting element, for example the second track 42. An interest of this coverage layer 60 is to protect the electrical tracks. Preferably, the material of this layer is an electrical insulator.

This layer 60 also has a mechanical interest by setting the electrical tracks at the neutral fibre, so as to make them reliable.

Typically, the layer 60 is made of a polymer material, such as SINR, PEN, PET, PC.

However, the layer 60 does not extend on top of the piezoelectric element 20 which is totally open (possibly except for the presence of the second track 42), which allows not reducing the performances as would be the case if the layer 60 were disposed on top with the unavoidable effect of dampening the deformations of the piezoelectric element.

Preferably, the coverage layer 60 is consistent; it could be obtained by milling. In the example represented in FIG. 12, the layer 60 covers the upper face of the bead 50 and its sidewall, which is preferably inclined. The protective layer 60 does not necessarily extend over the support 10; in FIG. 12, the contact between the support 10 and the layer 60 is performed over a width smaller than or equal to the thickness of the coverage layer 60.

Figure 16:
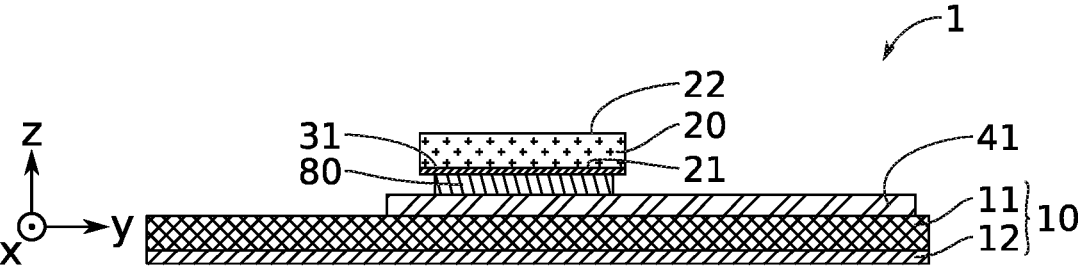

In another embodiment represented in FIG. 16, the bead 50 is not present, neither is the coverage layer 60. In this option, the electrical connection of the piezoelectric element 20 is performed from above. Of course, this electrical connection arrangement is compatible with the presence of the bead 50 alone or in combination with the coverage layer 60.

Figure 14:
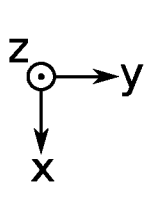
FIG. 14 shows another possibility with two electrodes over a face of an element.
Figure 14:
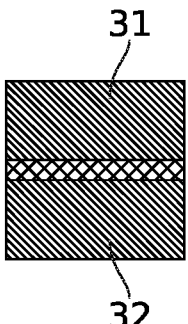

While in the previous examples, the second electrical connecting element cooperates with an area of the upper face 22 of the piezoelectric element 20, the configuration of FIG. 16 provides for this area being located over a portion of the lower face 21 of the piezoelectric element 20. In this context, it is possible to implement a division, with an intermediate insulation, of the lower face 21 of the piezoelectric element 20. As shown in FIG. 14, as a counterpoint to FIG. 13, the lower face 21 comprises a first electrode 31 and a second electrode 32 electrically insulated from each other by a strip of a dielectric material, which could be air. Each of the electrodes 31, 32 forms an electrical continuity, respectively, with the components of the first electrical connecting element and the elements of the second electrical connecting element.

Figure 15A:
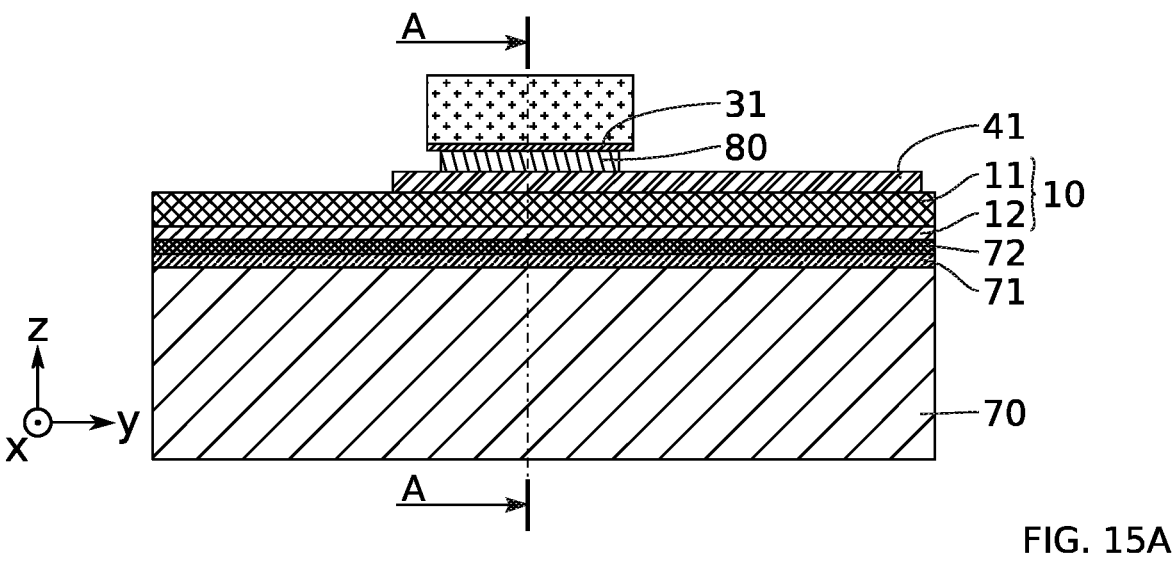
FIGS. 15A to 16 represent another embodiment.
Figure 15B:
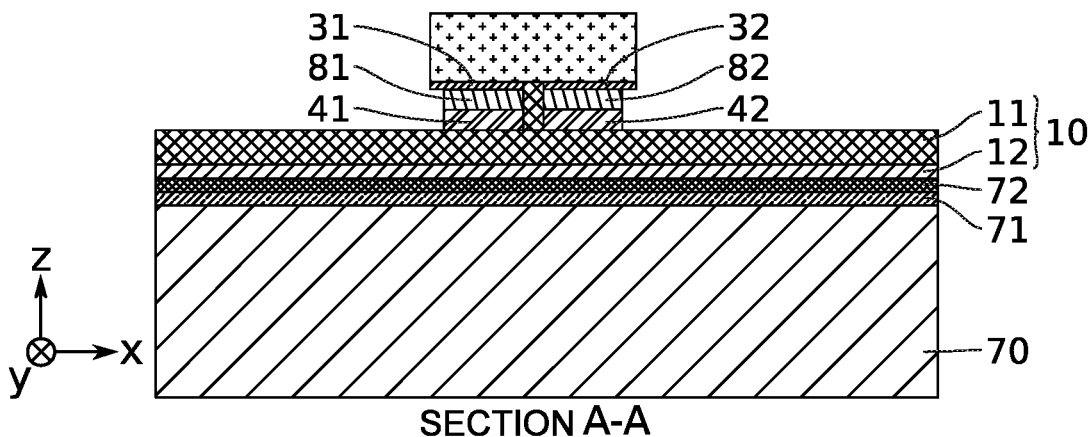

In this context, if the piezoelectric element 20 is mounted over the support 10 via a bonding layer 80, the latter is also divided into two portions electrically insulated from each other 81, 82. This configuration is represented in the manufacturing step corresponding to FIG. 15B. Thus, the electrical connection is achieved, for the first electrical connecting element, by the first track 41, a first portion 81 of the bonding layer 80 and the first electrode 31. In parallel, for the second electrical connecting element, this connection is achieved by the second track 42, a second portion 82 of the bonding layer 80 and the second electrode 32.

It should be noted that, irrespective of the embodiment, the presence of the electrode 31, 32 is not essential. In particular, the tracks 41, 42 may be applied directly over the piezoelectric element 20, or through other members, like the bonding layers 81 and 82.

The configuration of FIG. 16 has the advantage of not needing an electrical connection of the upper face 22 of the element 20, this connection involving a vertical insulation as in the case of FIGS. 9 and 12.

The device 1, as shown in the previous three variants, may be made by a manufacturing method an example of which is now given.

In FIG. 1, is represented the possibility of providing a substrate 70 adapted to serve as a support, preferably more rigid than the support 10, during some manufacturing steps. For example, the substrate 70 may consist of, or comprise, a layer of a semiconductor material, like silicon.

Figure 2:
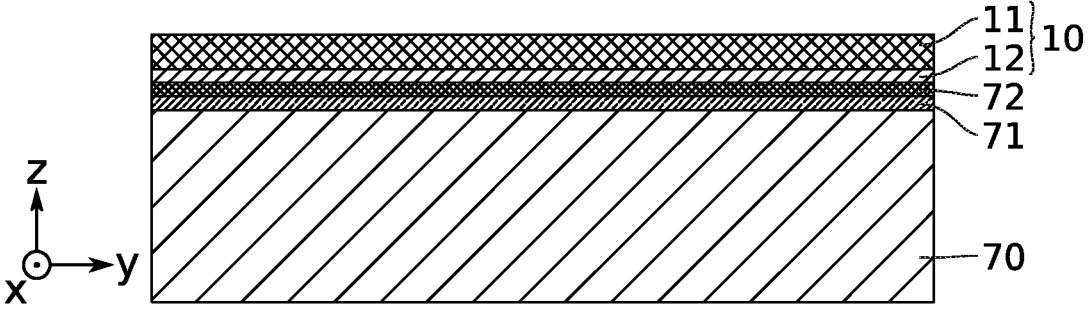

FIG. 2 shows that the support 10 could be manufactured by depositions of layers over a face of the substrate 70. The formation of a support 10, for example with an upper face 11 and an upper face 12 may correspond to the examples given before, in terms of material selection. Preferably, an intermediate portion 71, 72 is first deposited so as to serve as a portion for the subsequent detachment between the substrate 70 and the support 10. For example, this intermediate portion may comprise an interface layer 72 sandwiched between an intermediate layer 71 and the lower layer 12 of the support 10. The layer 71 may be made of the same material as the layer 12 and/or have the same thickness. For example, the interface layer 72 may be a bilayer comprising a first titanium underlayer (for example of 10 nm) and a second platinum underlayer, superimposed to the first one (for example of 100 nm). It will be seen that this arrangement allows creating an interface with a lower adhesive force than the other ones, to promote the detachment of the support 10 off the substrate 70 during a subsequent phase.

Figure 3:
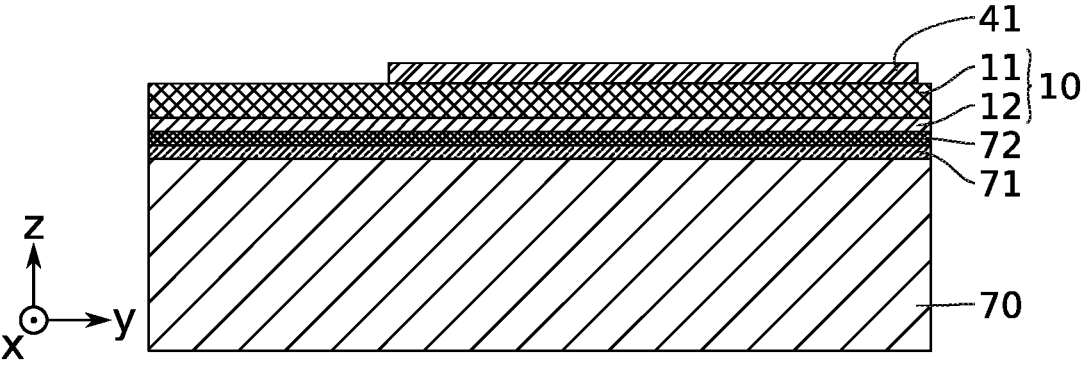

FIG. 3 shows an embodiment of a first track 41, for example made of one or several metal layer(s). It is possible to use conventional pattern deposition and definition techniques.

Figure 4:
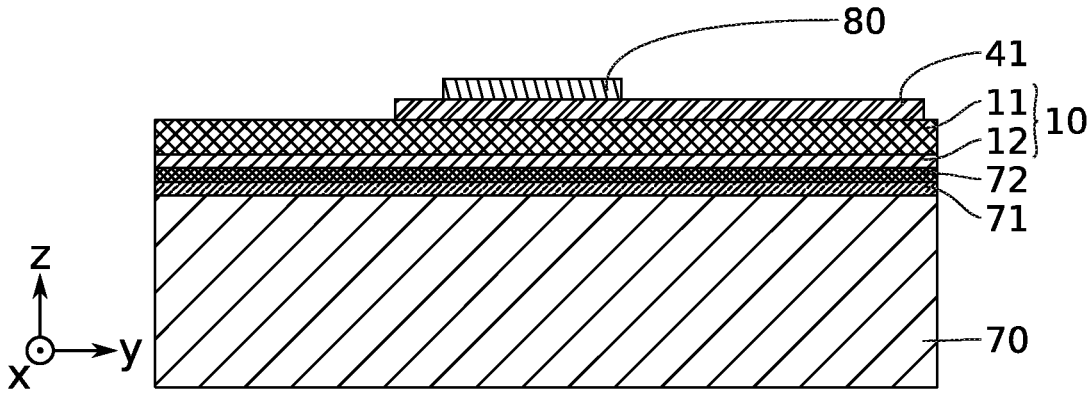

In FIG. 4, conductive glue is deposited, for example by screen printing, to form the bonding layer 80; it is in electrical continuity with the track 41.

Figure 5:
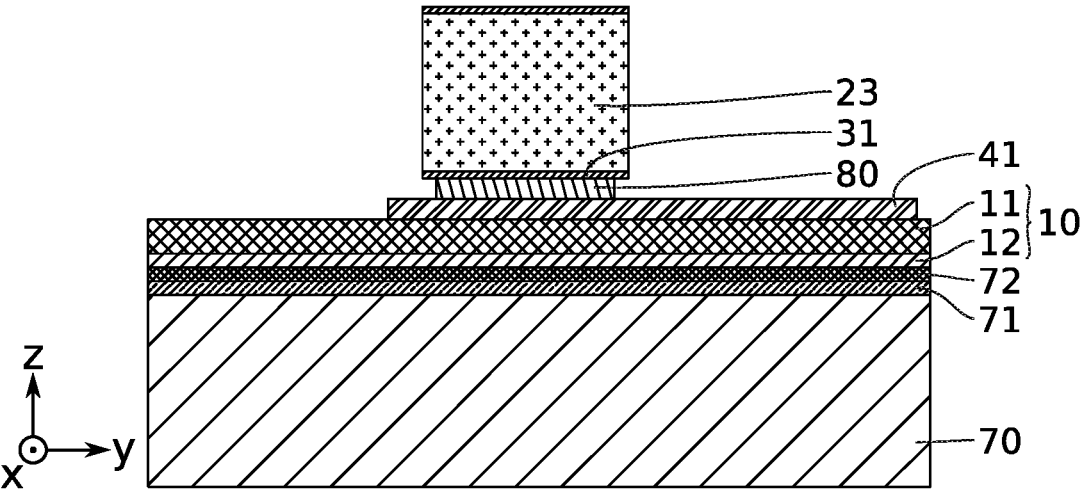

A piezoelectric block 23 is received by the bonding layer 80. The lower face of this block 23 forms the lower face of the piezoelectric element 20 to be formed. It is possible to use an off-the-shelf piezoelectric component as a block 23. Therefore, it may comprise, by its mere manufacture, a lower electrode (which could form at least one electrode 31, and possibly the second electrode 32 when it is located on the lower face 21) and an upper electrode, as this appears with the two thin layers surrounding the main portion of the block 23 in FIG. 5.

Figure 6:
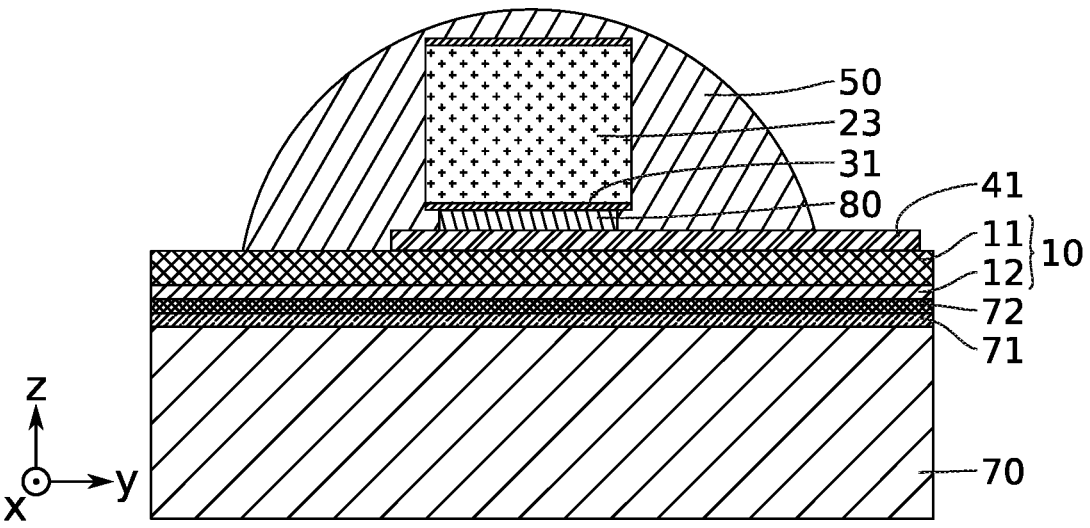

In the step corresponding to FIG. 6, the block 23 has been coated with a polymer material layer, for example by manual or automatic dispense with a syringe, with a polymerization annealing. It is the basal portion of this layer that will form the bead 50.

Figure 7:
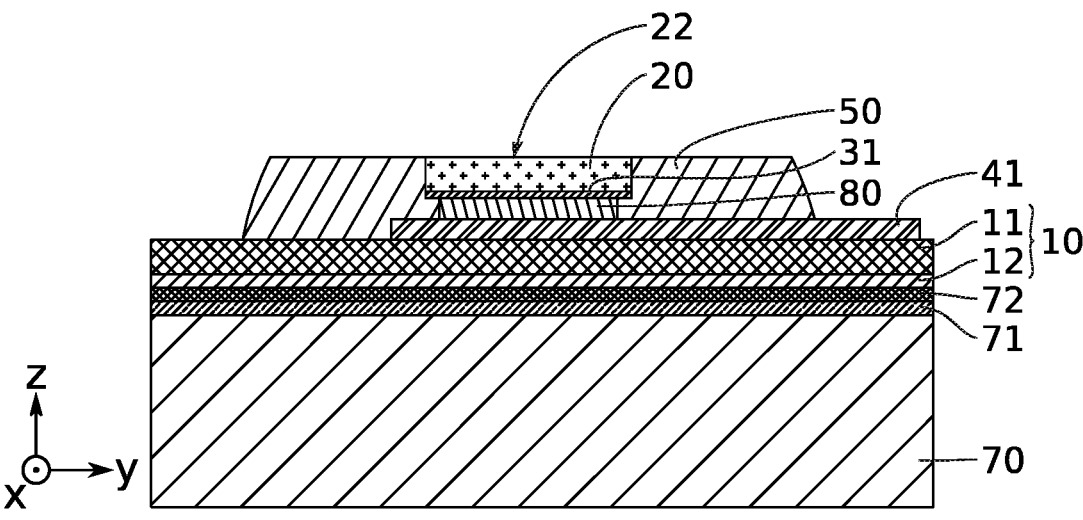

Afterwards, a thinning is performed starting from the top of the block 23, so as to bring the thickness of the piezoelectric material to a predetermined value, allowing monitoring the thickness of the piezoelectric element 20 to be formed. This thinning could be performed by grinding and/or mechanical and/or chemical-mechanical polishing. The end result is the piezoelectric element 20 visible in FIG. 7 and obtained starting from the thicker piezoelectric block 23. An advantage of such thinning is obtaining an upper face of the entire device that is planar and parallel to the support, the bead 50 being flush at the level of the upper face 22 of the piezoelectric element 20. At this level, the latter is shaped and its thickness is monitored.

Possibly, the bead 50 may be manufactured after the reduction of the thickness of the block 23. Moreover, as seen before, the formation of the bead 50 is optional and, in this case, only the block 23 is concerned by thinning. Resorting to this thinning might appear as a drawback inducing a manufacturing step and a loss of the piezoelectric material; however, it allows monitoring the thickness of the piezoelectric element 20 while avoiding manipulations of the piezoelectric element 20 which could prevent reaching small thicknesses.

Figure 8:
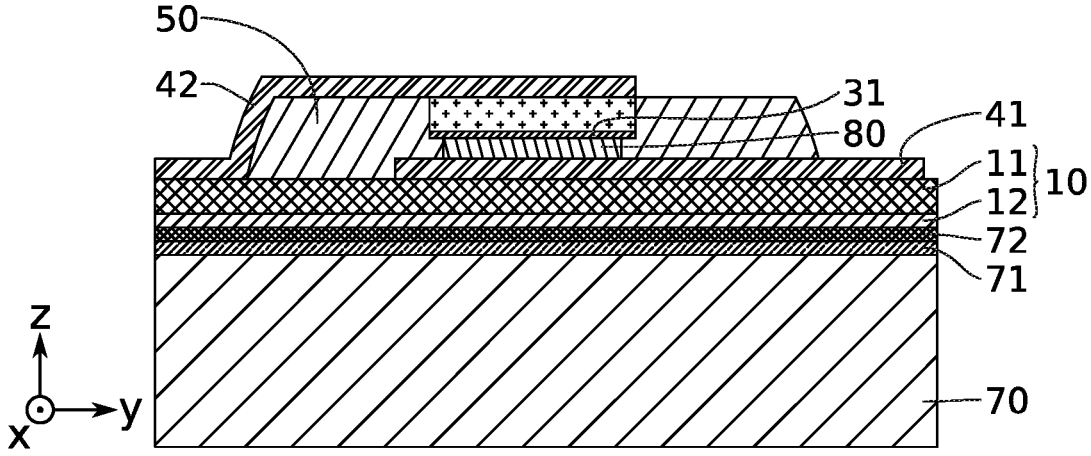

FIG. 8 shows the creation of a second track 42, for example in a manner similar to the formation of the track 41, but this time on top of the bead 50.

Preferably, the substrate 70 is preserved until the end of these steps. When the device is completed, or to the very least some manufacturing steps have been completed, the support 10 is detached off the substrate 70. The end result corresponds to that of FIG. 9, in the first example of configuration of the device.

Advantageously, the removal of the substrate 70 is achieved thanks to the interface layer 72. The latter is a sacrificial layer etched selectively in its surrounding, to detach the support 10. To eliminate the substrate 70, it is possible to consider: dissociation at the level of a layer having been subjected to an ion implantation, thinning through the back face of the substrate 70 for example. It is also possible to select the layer 72 so that it has, at its interface, either with the underlayer, or with the layer than immediately tops it, a lower adhesive force than at the other interface. Thus, when a mechanical separating force, typically by peeling, is applied to the support, the separation will occur at the interface with the lower adhesive force.

Figure 11:
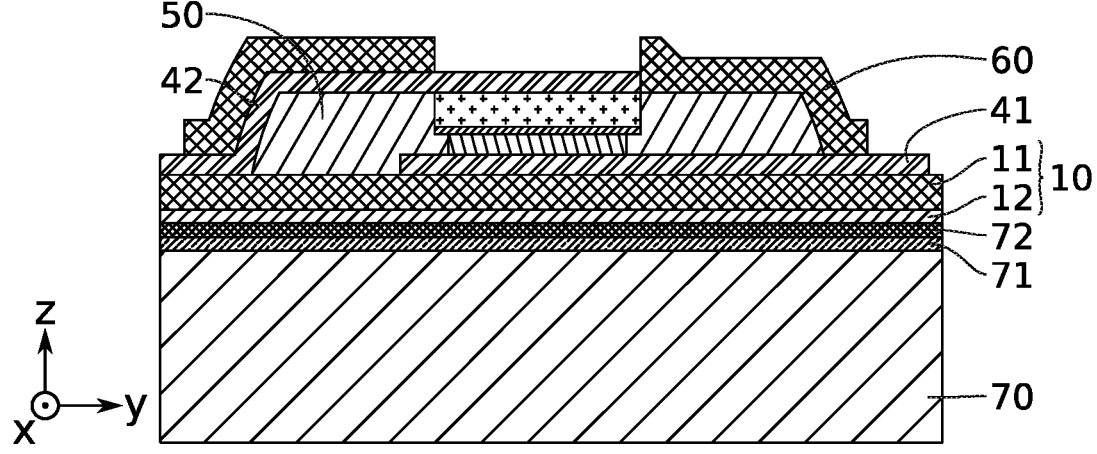
FIGS. 11 and 12 represent another embodiment.

In the case of the variant shown in FIG. 11, with the presence of a coverage layer 60, the latter may be formed upon completion of the state of FIG. 8, preferably before the separation of the substrate 70. The layer 70 may be obtained by milling of a polymer material, while keeping an opening in line with the entirety of the upper face 22 of the piezoelectric element 20.

In the case of the final variant represented in FIG. 16, the manufacture could be performed as before, while omitting the manufacture of the bead 50 and of the coverage layer 60. In this embodiment, and more generally each time the two electrical connecting elements are connected to the lower face 21 of the piezoelectric element 20, and when the block 23 is equipped with a lower electrode, it is possible to resort to a division of this electrode into two portions, so as to form the first electrode 31 and the second electrode 32 an example of which is visible in FIG. 14. A machining, sawing for example, allows reaching such a result, before mounting the block 23 over the bonding layer 80.

Figure 10:
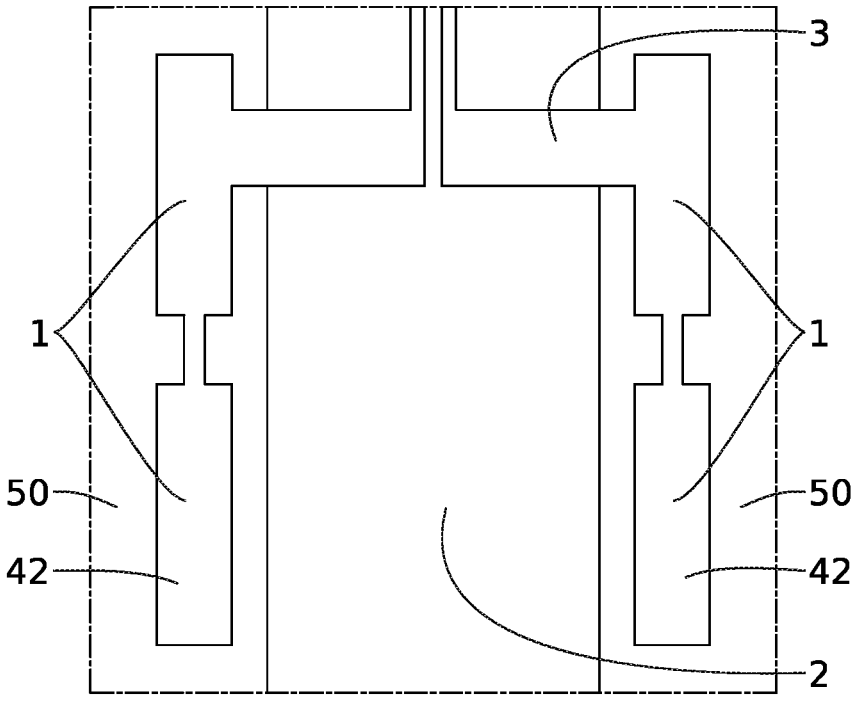
FIG. 10 shows an example of application of a vibrating plate system.

FIG. 10 shows a system for the implementation of one or several device(s) 1 as described before.

In this instance, this consists of a vibrating plate system, including a plate 2, for example made of glass, with a rectangular and possibly square shape, two opposite sides of which are mechanically linked to one or several device(s) 1. In FIG. 10, on two opposite edges, two devices are connected in parallel, advantageously symmetrically with respect to an axis of symmetry of the plate. An electrical connection line 3 allows powering the devices 1, preferably connected in parallel on either side of the plate, to control them. In particular, a Lamb mode type vibratory mode could be applied to the plate in this manner. A reverse operation, as a sensor, is also possible based on such devices 1.

The invention is not limited to the previously-described embodiments and extends to all embodiments covered thereby. In particular, the different aspects described for each of the embodiments, object of an illustration could be implemented in combination with any other aspect described in other illustrated cases.

The invention claimed is:

1. A piezoelectric transducer device comprising:
a support,
a piezoelectric element, and
a first electrical connecting element and a second electrical connecting element,
the piezoelectric element being carried by the support and each of the first and second electrical connecting elements being electrically connected, respectively, to a first area and a second area, distinct from the first area, of the piezoelectric element, the piezoelectric element including a lower face opposite the support and an upper face, opposite to the lower face,
wherein the upper face is integrally exposed or the upper face is at least partially covered only with the second electrical connecting element without any other direct or indirect coverage of the upper face by another element.

2. The piezoelectric transducer device according to claim 1, comprising a bead made of a polymer material surrounding the piezoelectric element.

3. The piezoelectric transducer device according to claim 2, wherein the bead extends laterally at less than 5,000 microns from the piezoelectric element.

4. The piezoelectric transducer device according to claim 2, wherein the bead has an upper face coplanar with the upper face.

5. The piezoelectric transducer device according to claim 2, wherein the second area is located on the upper face.

6. The piezoelectric transducer device according to claim 5, comprising a coverage made of a polymer material partially covering the second electrical connecting element and at least partially the bead, without covering the upper face.

7. The piezoelectric transducer device according to claim 1, wherein the first area and the second area are located on the lower face.

8. The piezoelectric transducer device according to claim 7, comprising a coverage made of a polymer material partially covering the first electrical connecting element and the second electrical connecting element, without covering the upper face.

9. The piezoelectric transducer device according to claim 1, wherein the support is flexible.

10. The piezoelectric transducer device according to claim 1, wherein the piezoelectric element has a dimension in thickness smaller than or equal to 100 microns.

11. The piezoelectric transducer device according to claim 1, forming a mechanical actuator.

12. The piezoelectric transducer device according to claim 1, wherein the piezoelectric element is at least partially made of a ceramic.

13. A method for manufacturing a piezoelectric transducer device comprising a support, a piezoelectric element, a first electrical connecting element and a second electrical connecting element, the piezoelectric element being carried by the support and each of the first and second electrical connecting elements being electrically connected, respectively, to a first area and a second area, distinct from the first area, of the piezoelectric element, the piezoelectric element including a lower face opposite the support and an upper face, opposite to the lower face, the method comprising:
bonding a piezoelectric block on the support so as to place the lower face of the piezoelectric block opposite the support;
thinning the piezoelectric block from its upper face opposite to its lower face, so as to obtain the piezoelectric element with a predefined dimension in thickness, the upper face of the piezoelectric element being left integrally exposed or the upper face of the piezoelectric element being at least partially covered only with the second electrical connecting element without any other direct or indirect coverage of the upper face by another element.

14. The method according to claim 13, comprising, before the thinning, a formation of the support over a substrate, and after the thinning, a dismount of the support off the substrate.

15. The method according to claim 14, comprising a formation of the first electrical connecting element and of the second electrical connecting element, wherein method bonding is configured to set the first electrical connecting element and the second electrical connecting element in contact, respectively, with the first area and the second area, the first area and the second area being located on the lower face of the piezoelectric element.

16. The method according to claim 15, comprising a supply of the piezoelectric block which comprises an electrode on its lower face, a division of the electrode into a first portion and a second portion which are electrically insulated from each other, the first portion and the second portion forming, respectively, the first area and the second area.

17. The method according to claim 13, further comprising:

after the bonding and before the thinning, coating the piezoelectric block with a polymer material layer, and thinning the polymer material layer concomitantly with the thinning the piezoelectric block so as to obtain a bead surrounding the piezoelectric element and flush with a level of the upper face of the piezoelectric element.

\* \* \* \* \*